United States Patent [19]
Drynan

[11] Patent Number: 6,096,632
[45] Date of Patent: Aug. 1, 2000

[54] FABRICATION METHOD OF SEMICONDUCTOR DEVICE USING CMP PROCESS

[75] Inventor: John Mark Drynan, Tokyo, Japan

[73] Assignee: NEC Corporation, Tokyo, Japan

[21] Appl. No.: 09/058,141

[22] Filed: Apr. 10, 1998

[30] Foreign Application Priority Data

Apr. 11, 1997 [JP] Japan ................................. 9-093833

[51] Int. Cl.⁷ .............................................. H01L 21/4763
[52] U.S. Cl. ........................ 438/618; 438/633; 438/692; 438/693
[58] Field of Search .................................. 438/618, 633, 438/692, 693, 675, 637, 634, 697

[56] References Cited

U.S. PATENT DOCUMENTS

| | | | |
|---|---|---|---|
| 5,300,813 | 4/1994 | Joshi et al. | 257/752 |
| 5,362,669 | 11/1994 | Boyd et al. | |
| 5,658,830 | 8/1997 | Jeng | 438/620 |
| 6,960,314 | 9/1999 | Rhodes et al. | 438/626 |

FOREIGN PATENT DOCUMENTS

| | | |
|---|---|---|
| 8-288389 | 11/1996 | Japan . |
| 9-148431 | 6/1997 | Japan . |

OTHER PUBLICATIONS

Chris Yu et al., "Improved Multilevel Metallization Technology Using Chemical Mechanical Polishing of W Plugs and Interconnects", Proceeding of VLSI Multilevel Inter Connection Conference (VMIC), Jun. 7–8, 1994, pp. 144–150.

*Primary Examiner*—Caridad Everhart
*Attorney, Agent, or Firm*—Young & Thompson

[57] ABSTRACT

A fabrication method of a semiconductor device is provided, which eliminates the effects of polishing residue generated by a CMP process. A first layer having a hole is prepared, where the first layer may be formed directly on a surface of a semiconductor substrate or formed over a surface of a semiconductor substrate through at least one layer. A second layer is then formed to cover the hole. The hole is not filled with the second layer to thereby form a gap on the second layer. A protection layer is formed on the second layer so that the gap is filled with the protection layer. The protection layer and the second layer are removed by a CMP process until the first layer is exposed, thereby selectively leaving the protection layer and the second layer in the hole. The second layer left in the hole serves as a plug. A third layer is formed on the second layer to cover the plug. Preferably, a step of selectively removing the protection layer left in the gap is additionally provided prior to the CMP process.

15 Claims, 15 Drawing Sheets

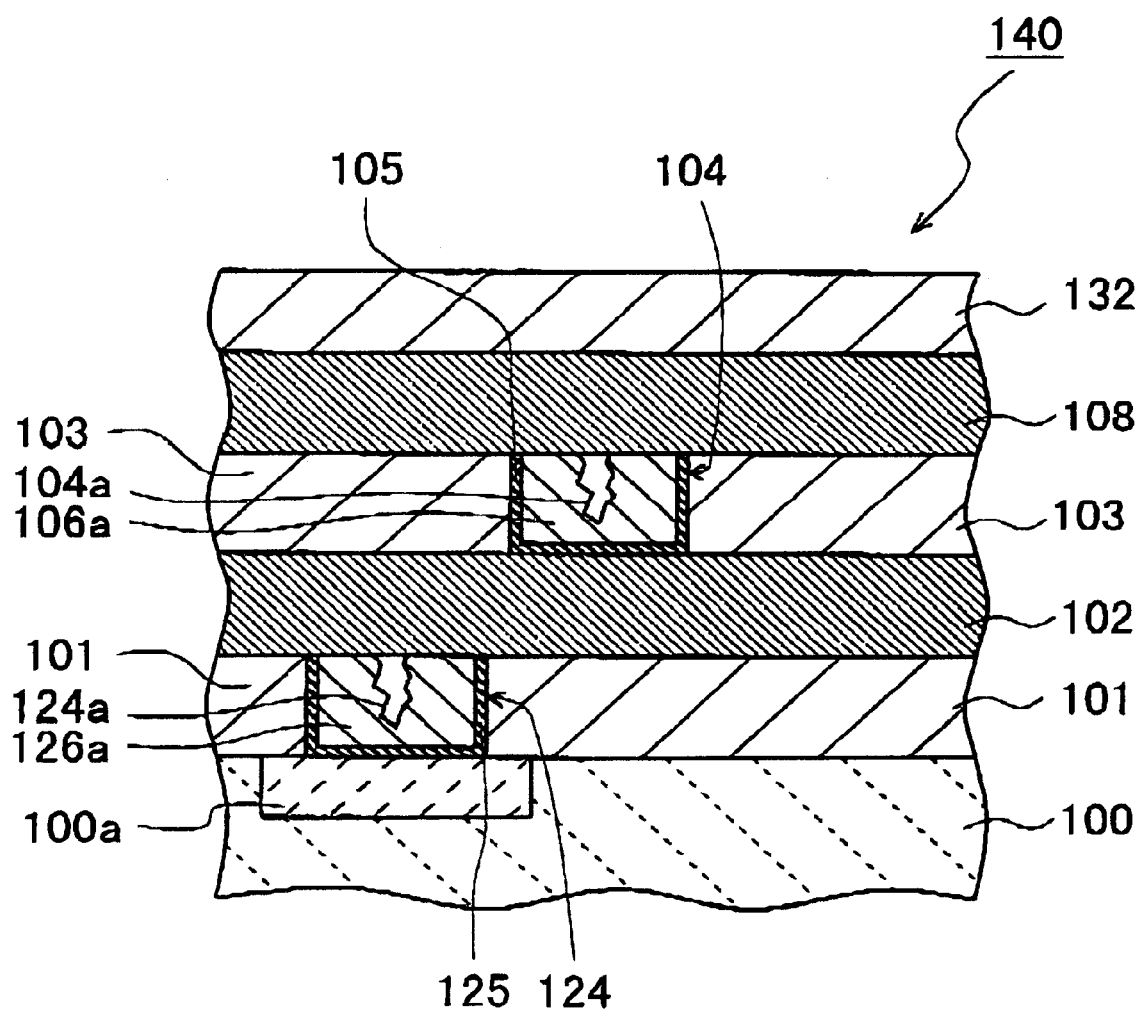

FABRICATION METHOD OF SEMICONDUCTOR DEVICE USING CMP PROCESS

BACKGROUND OF THE INVENTION

1. Field of the Invention

The present invention relates to a fabrication method of a semiconductor device and more particularly, to a fabrication method of a semiconductor device using a Chemical Mechanical Polishing (CMP) process for surface planarization.

2. Description of the Prior Art

In recent years, surface planarization techniques have been becoming very important to form multilevel wiring or interconnection structures in Large-Scale Integrated (LSI) circuits.

In the multilevel wiring structures, electrical interconnection between different-level wiring layers is achieved by using electrically conductive plugs that are formed in contact holes of an interlayer dielectric layer intervening between the wiring layers. The conductive plugs are typically made of a metal such as tungsten (W).

Conventionally, the metallic conductive plugs are typically formed in the following way.

First, contact holes are formed in an interlayer dielectric layer to penetrate the same. Then, a metallic material is deposited on the interlayer dielectric layer by a Chemical Vapor Deposition (CVD) process having a good gap-filling capability. The metallic material is deposited not only on the surface of the interlayer dielectric layer but also on the bottom and side walls of the contact holes during this process.

Subsequently, the deposited metallic material on the surface of the interlayer dielectric layer is subjected to a CMP process until the surface of the interlayer dielectric layer is exposed, thereby removing the deposited metallic material on the surface of the interlayer dielectric layer while leaving the deposited metallic material in the contact holes. Thus, the surface of the interlayer dielectric layer is exposed and planarized and at the same time, the contact holes are filled with the metallic material. The remaining metallic material in the contact holes serves as the conductive plugs.

Since the surface of the interlayer dielectric layer including the tops of the conductive plugs is planarized, there is an advantage that a metallic layer for a next wiring layer can be formed on the planar surface.

The CMP process has the following advantages. First, the chip-level planarity, which is required for giving a specific margin to the depth of focus in photolithography, is realized. Second, the fabrication yield and reliability are improved because the required metallic plugs are surely formed and the probability of open circuit is decreased.

Therefore, the CMP process has been applied not only to the planarization of surface steps (i.e., hills and valleys), and the formation of trench isolation structures, trench capacitors, contact plugs, and damascene wiring structures.

In the CMP process, typically, a semiconductor wafer or substrate is held on a rotating carrier and a polishing pad is attached onto a rotating table. The pad is then contacted with the surface of a target layer on or over the wafer while supplying a slurry as a polishing medium to the contact area of the target layer with the pad. The slurry is typically made of a solution of a strong alkali or acid in which colloidal silica or alumina particles are dispersed. The surface of the target layer is chemically polished by the strong alkali or acid and at the same time, mechanically polished by the silica or alumina particles.

FIG. 1 shows a partial cross-section of a semiconductor device with a multilayer wiring structure.

As shown in FIG. 1, the semiconductor device 1440 is comprised of a semiconductor (e.g., single-crystal silicon) substrate 1400, a first interlayer dielectric layer 1422 formed on a surface of the substrate 1400, a first-level wiring layer 1401 formed on the first interlayer dielectric layer 1422, a second interlayer dielectric layer 1402 formed on the first-level wiring layer 1401, a second-level wiring layer 1407 formed on the second interlayer dielectric layer 1402, and a third interlayer dielectric layer 1432 formed on the second-level wiring layer 1407.

The layered structure including wiring layers in a third level or higher, which are located above the third interlayer dielectric layer 1432, is omitted here for the sake of simplification.

The substrate 1400 has a diffusion region 1400a in its surface area.

The first- and second-level wiring layers 1401 and 1407 have specific wiring patterns.

The first interlayer dielectric layer 1422 has a contact hole 1423 filled with a metallic barrier layer 1424 and a metallic plug 1425a. The barrier layer 1424 covers the bottom and side walls of the contact hole 1423. The metallic plug 1425a is located on the barrier layer 1424. The diffusion region 1400a and the first wiring layer 1401 are electrically connected to one another through the metallic plug 1425a and the barrier layer 1424.

Similarly, the second interlayer dielectric layer 1402 has a contact hole 1403 filled with a metallic barrier layer 1404 and a metallic plug 1405a. The barrier layer 1404 covers the bottom and side walls of the contact hole 1403. The metallic plug 1405a is located on the barrier layer 1404. The first wiring layer 1401 and the second first wiring layer 1407 are electrically connected to one another through the metallic plug 1405a and the barrier layer 1404.

With the semiconductor device 1440 shown in FIG. 1, the barrier layer 1404 and the metallic plug 1405a are, for example, formed in the contact hole 1403 of the second interlayer dielectric layer 1402 in the following way.

As shown in FIG. 2A, after the second interlayer dielectric layer 1402 is formed on the first-level wiring layer 1401, the contact hole 1403 is formed in the layer 1402 by known processes. Then, the barrier layer 1404 is formed on the second interlayer dielectric layer 1402 to cover the contact hole 1403 by a known process. The barrier layer 1404 covers not only the surface of the second interlayer dielectric layer 1402 but also the bottom and side walls of the contact hole 1403.

Subsequently, a metallic layer 1405, which is typically made of tungsten, is formed on the barrier layer 1404 by a CVD process. In this process, as clearly shown in FIG. 2A, the surface of the metallic layer 1405 becomes very rough, because the metallic layer 1405 has different growth rates according to the crystal-growth directions. Consequently, the contact hole 1403 is not fully filled with the metallic layer 1405, resulting in a narrow gap 1403a termed a void at the contact hole 1403.

Then, the metallic layer 1405 and the barrier layer 1404 are removed until the surface of the second interlayer dielectric layer 1402 is exposed by a CMP process, thereby forming the contact plug 1405a in the contact hole 1403. During this CMP process, the gap or void 1403a is left in the plug 1405a. Because the top of the gap or void 1403a is opened due to the polishing action, the gap 1403a is fully filled with a polishing residue 1406, as shown in FIG. 2B.

The polishing residue 1406 filled in the gap 1403a is unable to be removed by a subsequent washing or cleaning process. Therefore, the polishing residue 1406 is left in the gap 1403a even after a washing or cleaning process.

Further, the second-level wiring layer 1407 is formed on the exposed and planarized surface of the second interlayer dielectric layer 1402 by a known process. Thus, as shown in FIG. 2C. the polishing residue 1406 is completely confined in the gap 1403a.

It has been found that the polishing residue 1406 in the gap 1403a serves as a contamination source to electronic devices on the substrate 1400, resulting in degradation of the performance and characteristics of the devices.

For example, the contact area between the contact plug 1405a and the second-level wiring layer 1407 is decreased and the contact resistance therebetween is increased. This leads to contact failure and/or abnormal operation. Also, it the polishing residue 1406 confined in the gap 1403a is released during a subsequent process, the residue 1406 will give bad effects to other devices, layers, or substrates.

SUMMARY OF THE INVENTION

Accordingly, an object of the present invention is to provide a fabrication method of a semiconductor device that eliminates the effects of polishing residue generated by a CMP process.

Another object of the present invention is to provide a fabrication method of a semiconductor device that improves the reliability of a semiconductor device.

The above objects together with others not specifically mentioned will become clear to those skilled in the art from the following description.

According to a first aspect of the present invention, a fabrication method of a semiconductor device is provided, which is comprised of the following steps (a) to (e).
(a) A first layer having a hole is prepared.

The first layer may be formed directly on a surface of a semiconductor substrate or formed over a surface of a semiconductor substrate through at least one layer.
(b) A second layer is formed to cover the hole. The hole is not filled with the second layer to thereby form a gap on the second layer.
(c) A protection layer is formed on the second layer so that the gap is filled with the protection layer.
(d) The protection layer and the second layer are removed by a CMP process until the first layer is exposed, thereby selectively leaving the protection layer and the second layer in the hole. The second layer left in the hole serves as a plug.
(e) A third layer is formed on the second layer to cover the plug.

With the fabrication method of a semiconductor device according to the first aspect of the present invention, the protection layer is formed on the second layer so that the gap on the second layer is filled with the protection layer. Then, the protection layer and the second layer are removed by a CMP process until the first layer is exposed, thereby selectively leaving the protection layer and the second layer in the hole.

Thus, the CMP process is performed after the gap is filled with the protection layer and therefore, the polishing residue generated by the CMP process does not enter the gap during the CMP process. As a result, the effects of the polishing residue are eliminated. This means that the reliability of a semiconductor device is improved.

In a preferred embodiment of the method according to the first aspect, a step (f) of selectively removing the protection layer left in the gap is additionally provided between the steps (d) and (e).

In this case, there is an additional advantage that the effects of the protection layer left in the gap are eliminated.

If the protection layer left in the gap has a low melting point, the protection layer may be melted or vaporized, or may generate some gas during a subsequent process or processes, which will give bad effects to the third layer. The bad effects can be avoided by addition of the step (f).

In another preferred embodiment of the method according to the first aspect, the protection layer is made of a metal or its compound capable of filling the gap.

In this case, there is an additional advantage that the contact resistance between the third layer and the plug is decreased when the second layer is made of a metal.

Preferably, the protection layer is made of aluminum (Al), copper (Cu), titanium (Ti), titanium nitride (TiN), titanium tungstenide (TiW), tantalum (Ta), tantalum nitride (TaN), tantalum tungstenide (TaW), tungsten silicide (WSi), or titanium silicide (TiSi). These metals have a good ability to fill the gap.

In still another preferred embodiment of the method according to the first aspect, the protection layer is made of a material capable of coating such as SOG materials used in the SOC technique and resist materials used in the lithography technique. This is because these materials capable of coating have a good ability of filling the gap.

In this case, there is an additional advantage that the process of forming the protection layer is simplified.

In a further preferred embodiment of the method according to the first aspect, the first layer is made of an electrically insulating material, the second layer is made of a metallic material, and the third layer is made of an electrically insulating material.

In this case, there is an additional advantage that a multilevel wiring structure is realized.

According to a second aspect of the present invention, another fabrication method of a semiconductor device is provided, which is comprised of the following steps (a) to (d).
(a) A first layer having a hole is prepared.

The first layer may be formed by a semiconductor substrate itself, or may be formed directly on a surface of a semiconductor substrate or over a surface of a semiconductor substrate through at least one layer.
(b) A second layer is formed to cover the hole. The hole is not filled with the second layer to thereby form a gap on the second layer.
(c) A protection layer is formed on the second layer so that the gap is filled with the protection layer.
(d) The protection layer and the second layer are removed by a CMP process until the first layer is exposed, thereby selectively leaving the protection layer and the second layer in the hole.

With the fabrication method of a semiconductor device according to the second aspect of the present invention, the second layer is formed to cover the hole of the first layer, and the hole is not filled with the second layer to thereby form the gap on the second layer. The protection layer is formed on the second layer so that the gap is filled with the protection layer. Then, the protection layer and the second layer are removed by a CMP process until the first layer is exposed, thereby selectively leaving the protection layer and the second layer in the hole.

Thus, the CMP process is performed after the gap on the second layer is filled with the protection layer and therefore, the polishing residue generated by the CMP process does not enter the gap during the CMP process. As a result, the effects of the polishing residue is eliminated. This means that the reliability of a semiconductor device is improved.

In a preferred embodiment of the method according to the second aspect, the first layer is formed by a semiconductor substrate, the second layer is made of an electrically insulating material, and the protection layer is made of an electrically conductive material.

In this case, the first layer (i.e., the substrate) and the protection layer left in the gap serve as a pair of electrodes, and the second layer serves as a dielectric layer, thereby constituting a trench capacitor.

In another preferred embodiment of the method according to the second aspect, the first layer is formed by a semiconductor substrate, the second layer is made of an electrically insulating material, and the protection layer is made of an electrically insulating material.

In this case, a trench isolation structure is achieved.

In still another preferred embodiment of the method according to the second aspect, the first layer is made of a electrically insulating material, and at least one of the second layer and the protection layer is made of an electrically conductive material.

In this case, a damascene wiring structure is achieved.

In a further preferred embodiment of the method according to the second aspect, a step (e) of removing the first layer and the protection layer left in the gap, a step (f) of forming a third layer made of an electrically insulating layer to cover the second layer, and a step (g) of forming a fourth layer made of an electrically conductive layer to cover the dielectric layer. The second layer is made of an electrically conductive material.

In this case, the second and fourth layers serve as a pair of electrodes, and the third layer serves as a dielectric layer, thereby constituting a capacitor.

As the protection layer, any electrically insulating or conductive material may be used if it has a good ability to fill the gap. For example, the electrically insulating and conductive materials listed in the above method according to the first aspect.

BRIEF DESCRIPTION OF THE DRAWINGS

In order that the present invention may be readily carried into effect, it will now be described with reference to the accompanying drawings.

FIG. 3 is a partial, cross-sectional view of a semiconductor device fabricated by a method according to a first embodiment of the present invention.

DETAILED DESCRIPTION OF THE PREFERRED EMBODIMENTS

Figure 1:
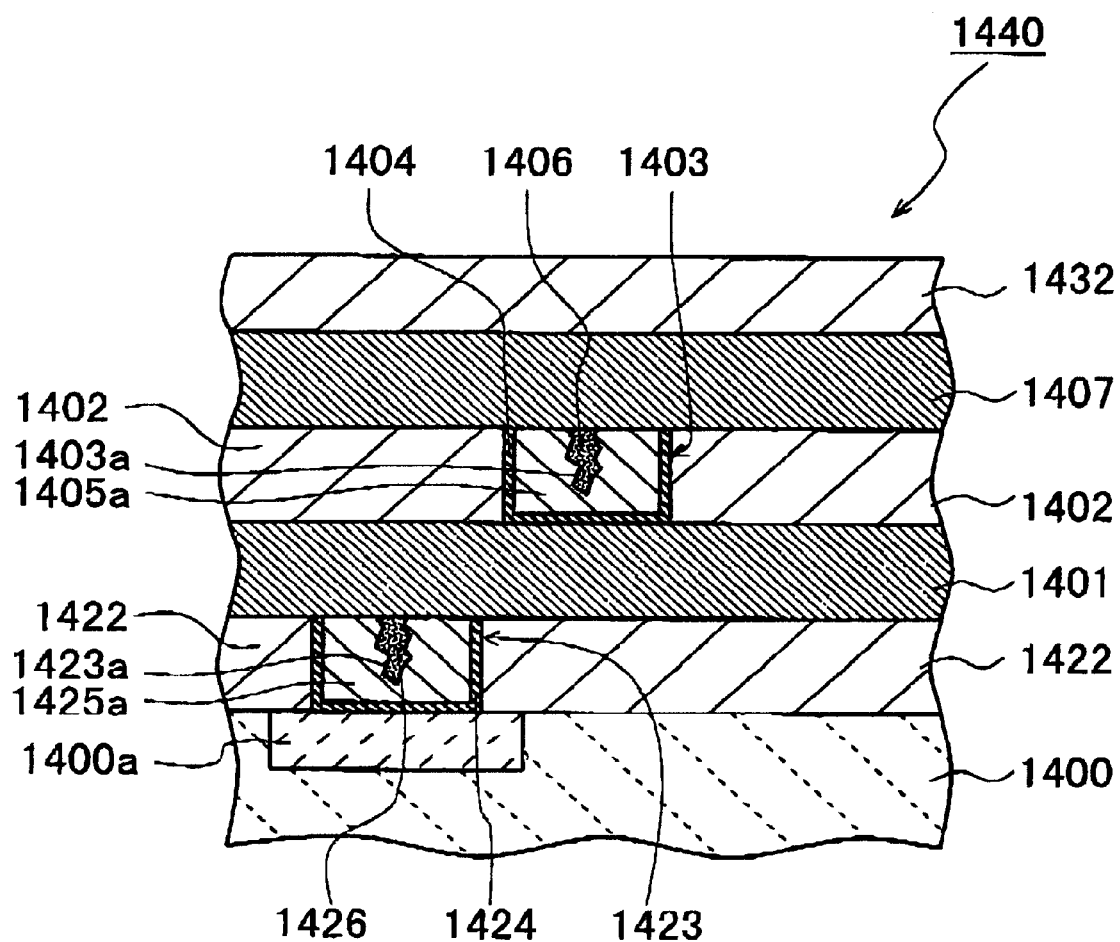
FIG. 1 is a partial, cross-sectional view of a semiconductor device fabricated by a conventional method.

Preferred embodiments of the present invention will be described in detail below while referring to the drawings attached.

FIRST EMBODIMENT

FIG. 3 shows a semiconductor device 140 with a multilayer wiring structure fabricated by a method according to a first embodiment.

As shown in FIG. 3, the semiconductor device 140 is comprised of a semiconductor substrate 100, a first interlayer dielectric layer 101 formed on a surface of the substrate 100, a first-level wiring layer 102 formed on the first interlayer dielectric layer 101, a second interlayer dielectric layer 103 formed on the first-level wiring layer 102, a second-level wiring layer 108 formed on the second interlayer dielectric layer 103, and a third interlayer dielectric layer 132 formed on the second-level wiring layer 108.

The layered structure including wiring layers in a third level or higher, which are located above the third interlayer dielectric layer 132, is omitted here for the sake of simplification.

The substrate 100 has a diffusion region 100a in its surface area. The diffusion region 100a is used as a part of a semiconductor element such as Metal-oxide-Semiconductor Field-Effect Transistor (MOSFET).

The first interlayer dielectric layer 101 has a contact hole 124 filled with a metallic barrier layer 125 and a metallic plug 126a. The barrier layer 125 covers the bottom and side walls of the contact hole 124. The metallic plug 126a is located on the barrier layer 125. The diffusion region 100a and the first wiring layer 102 are electrically connected to one another through the metallic plug 126a and the barrier layer 125.

Similarly, the second interlayer dielectric layer 103 has a contact hole 104 filled with a metallic barrier layer 105 and a metallic plug 106a. The barrier layer 105 covers the bottom and side walls of the contact hole 104. The metallic plug 106a is located on the barrier layer 105. The first wiring layer 102 and the second wiring layer 108 are electrically connected to one another through the metallic plug 106a and the barrier layer 105.

Here, the metallic barrier layers 105 and 125 are made primarily of titanium (Ti). The metallic plug 106a and 126a are made of tungsten (W).

In the case of a contact hole to a silicon substrate or a silicon wiring layer, the barrier layer may be comprised of Ti with TiN near the W plug and TiSi near the substrate or silicon wiring layer. In the case of a contact hole to a wiring layer other than silicon, the barrier layer may be comprised of Ti with TiN near the W plug, or it may be completely TiN.

With the semiconductor device 140 shown in FIG. 3, the barrier layer 105 and the metallic plug 106a are formed in the contact hole 104 of the second interlayer dielectric layer 103 in the following way.

Figure 4A:
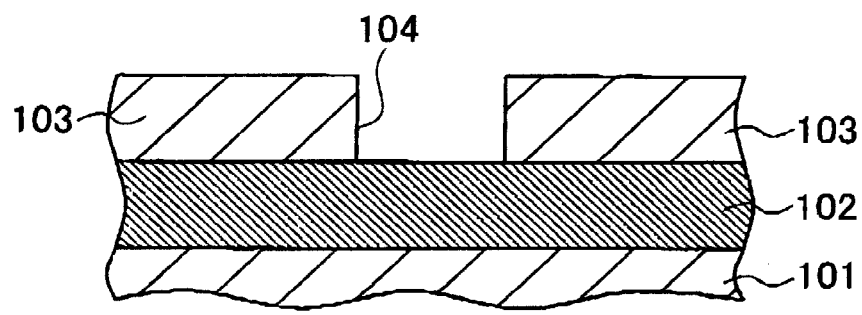
FIGS. 4A to 4F are partial, cross-sectional views showing the process steps of the method according to the first embodiment of the present invention, respectively.

As shown in FIG. 4A, after the second interlayer dielectric layer 103 is formed on the first-level wiring layer 102, the contact hole 104 is formed in the layer 103 by known processes.

Figure 4B:
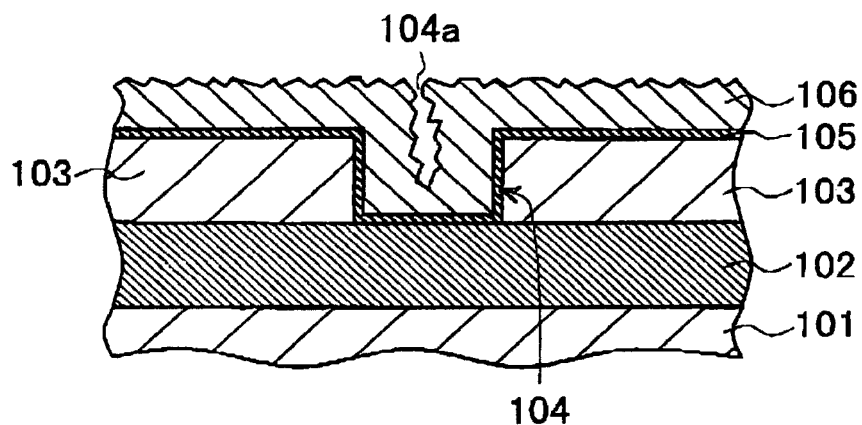
Figure 4C:
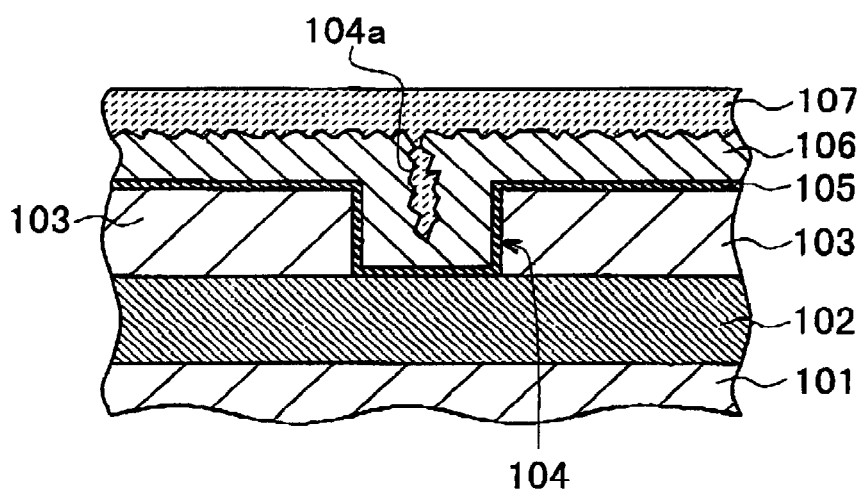

Then, as shown in FIG. 4B, the barrier layer 105 is formed on the second interlayer dielectric layer 103 to cover the contact hole 104 by a CVD process. The barrier layer 105 covers not only the surface of the second interlayer dielectric layer 103 but also the bottom and side walls of the contact hole 104.

Subsequently, as shown in FIG. 4B. a tungsten layer 106 is formed on the barrier layer 105 by a CVD process. In this process, the surface of the tungsten layer 106 becomes very rough, because the tungsten layer 106 has different growth rates according to the crystal-growth directions. Consequently, the contact hole 104 is not fully filled with the tungsten layer 106, resulting in a narrow gap 104a at the contact hole 104. In other words, the gap 104a is produced by the bad ability of the tungsten layer 106 to bury or fill a gap.

Figure 2A:
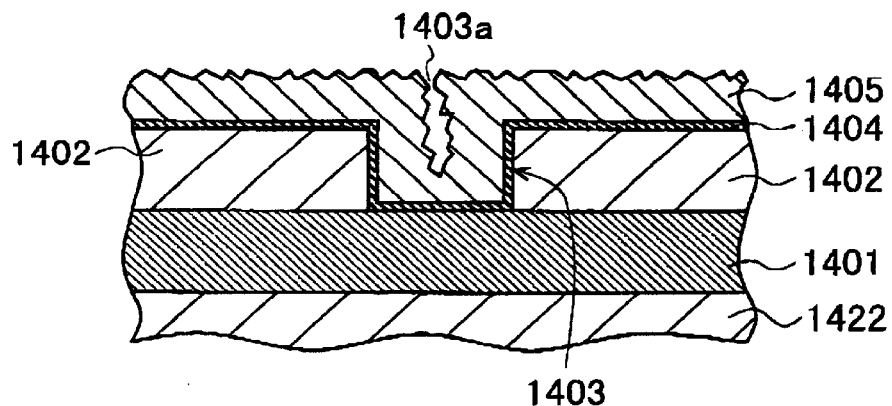
FIGS. 2A to 2C are partial, cross-sectional views showing the process steps of the conventional method, respectively.
Figure 2B:
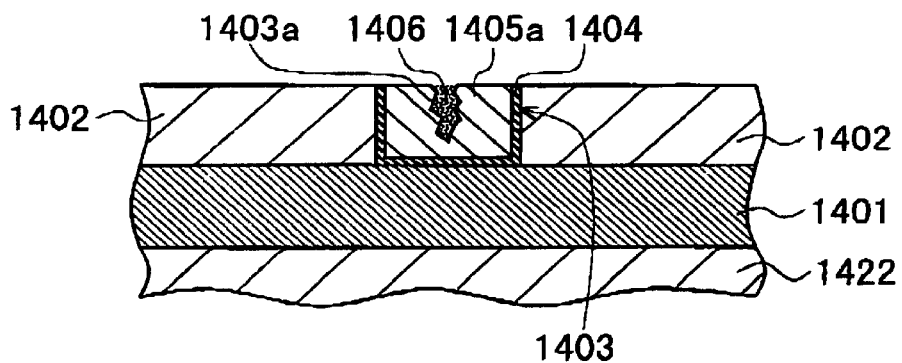
Figure 2C:
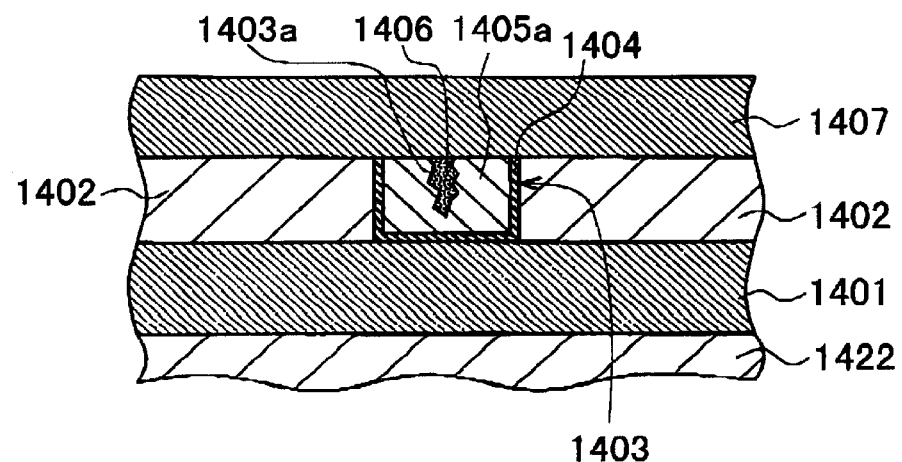

Following this step, unlike the conventional method shown in FIGS. 2A to 2C, a protection layer 107 having a planar surface is additionally formed on the tungsten layer 106 to fill the gap 104a.

Any material used in the known Spin-On-Glass (SOG) technique, which is termed a "SOG material" here, may be used for the protection layer 107, if it has a planar or flat surface and an ability to fill the gap 104a.

Typically, the SOG materials have good flowability. Therefore, they can be readily coated on the rough surface of the tungsten layer 106 to form a layer having a planar surface while filling the narrow gap 104a. A coated layer formed by the SOG materials has a property to become a hard layer after full curing through heat treatment.

Typical examples of the SOG materials are silicate-based and siloxane-based, which behave like silicon dioxide ($SiO_2$) after full curing.

Figure 4D:
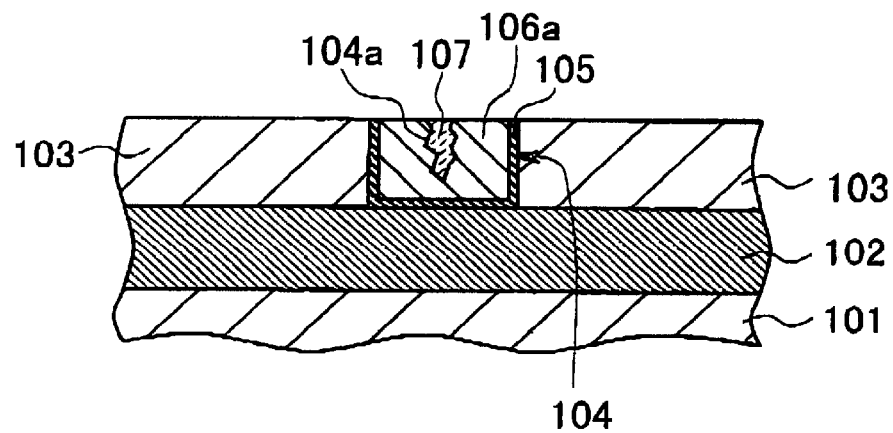

Subsequently, the protection layer 107 and the tungsten layer 106 are removed until the surface of the second interlayer dielectric layer 103 is exposed from the layers 106 and 107 by a CMP process, thereby forming the contact plug 106a in the contact hole 104, as shown in FIG. 4D.

Since the gap 104a has been filled with the protection layer 107 in the prior step of forming the protection layer 107, no polishing residue is buried into the gap 104a during this CMP process.

Figure 4E:
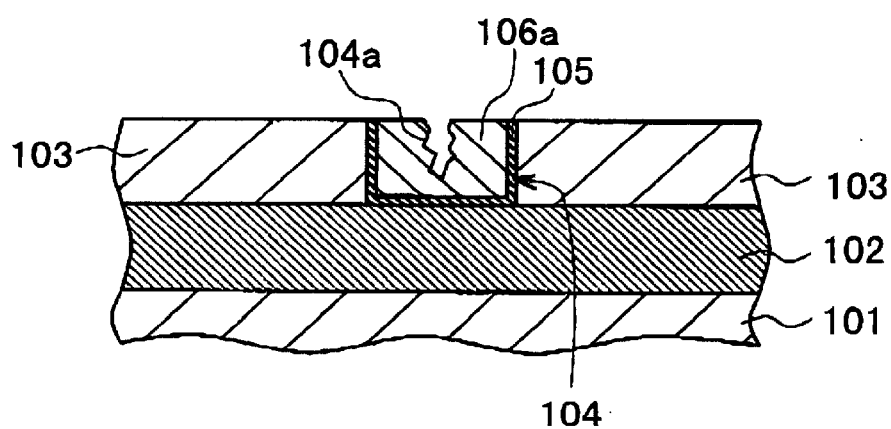

The protection layer 107 left in the gap 104a is then removed by a wet etching process using a hydrogen-fluoride (HF) based etching solution or a dry etching process using a proper etching gas. The state at this stage is shown in FIG. 4E.

Figure 4F:
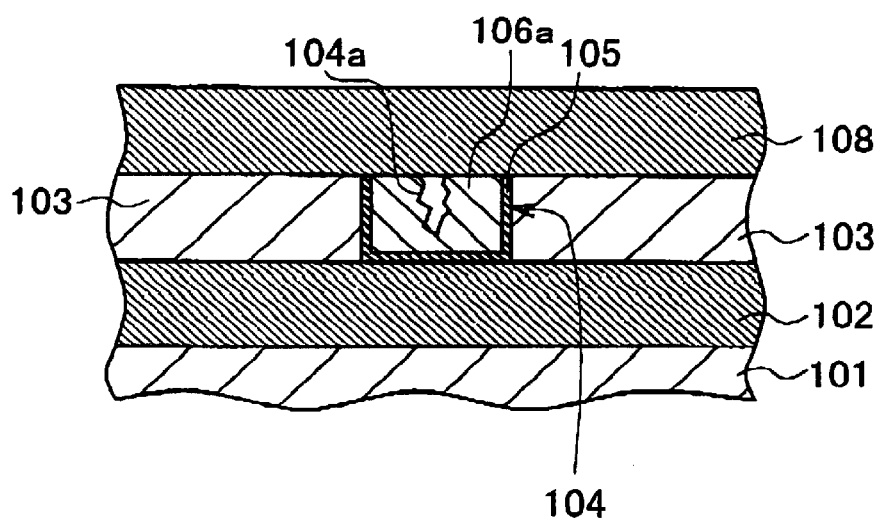

Further, as shown in FIG. 4F, the second-level wiring layer 108 is formed on the exposed and planarized surface of the second interlayer dielectric layer 103 by a known process. In this state, the atmospheric air is confined in the hollow gap 104a.

Thus, with the fabrication method according to the first embodiment, the second-level wiring layer 108 is electrically connected to the first-level wiring layer 102 through the tungsten plug 106a and the barrier layer 105 without leaving any polishing residue. Consequently, no contamination source to electronic devices on the substrate 100 exists and therefore, degradation of the performance and characteristics of the devices is prevented from occurring.

The barrier layer 125 and the metallic plug 126a are formed in the contact hole 124 of the first interlayer dielectric layer 101 in the same way as the barrier layer 105 and the metallic plug 106a.

SECOND EMBODIMENT

Figure 5:
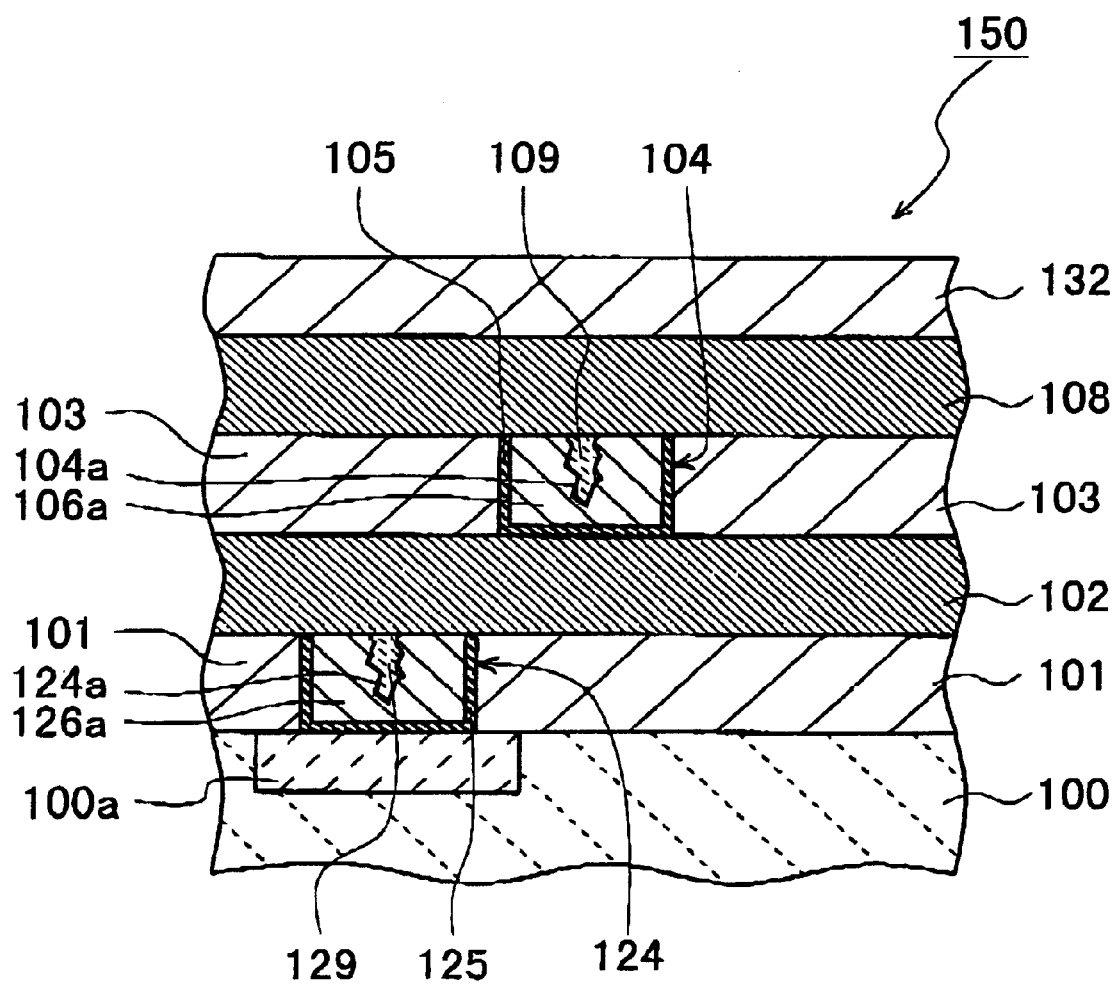
FIG. 5 is a partial, cross-sectional view of a semiconductor device fabricated by a method according to a second embodiment of the present invention.

FIG. 5 shows a semiconductor device 150 with a multilayer wiring structure fabricated by a method according to a second embodiment.

This device 150 fabricated the method according to the second embodiment has a same configuration as the device 140 fabricated by the method according to the first embodiment, except that the gaps 104a and 124a in the tungsten plugs 106a and 126a are filled with titanium layers 109 and 129, respectively. Therefore, explanation relating to the same configuration is omitted here by adding the same reference numerals to the same or corresponding elements in FIG. 5.

In the semiconductor device 150, the barrier layer 105 and the metallic plug 106a are formed in the contact hole 104 of the second interlayer dielectric layer 103 in the following way.

Figure 6A:
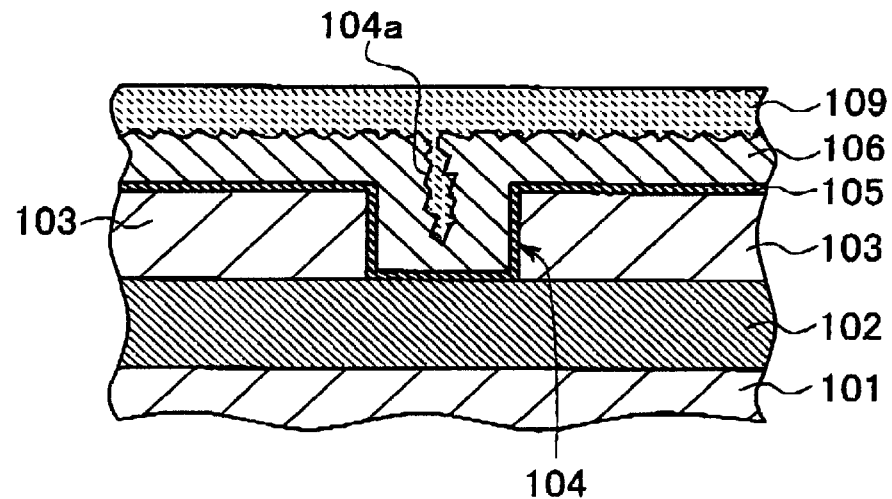
FIGS. 6A to 6C are partial, cross-sectional views showing the process steps of the method according to the second embodiment of the present invention, respectively.

As shown in FIG. 6A, after a tungsten layer 106 is formed on the barrier layer 105 by a CVD process, a protection layer 109 having a planar surface is additionally formed on the tungsten layer 106 to fill the gap 104a. The protection layer 109 is here a titanium (Ti) layer. Because the titanium layer 109 has a good ability to bury or fill the gap 104a, the narrow gap 104a is fully filled with the titanium layer 109.

Figure 6B:
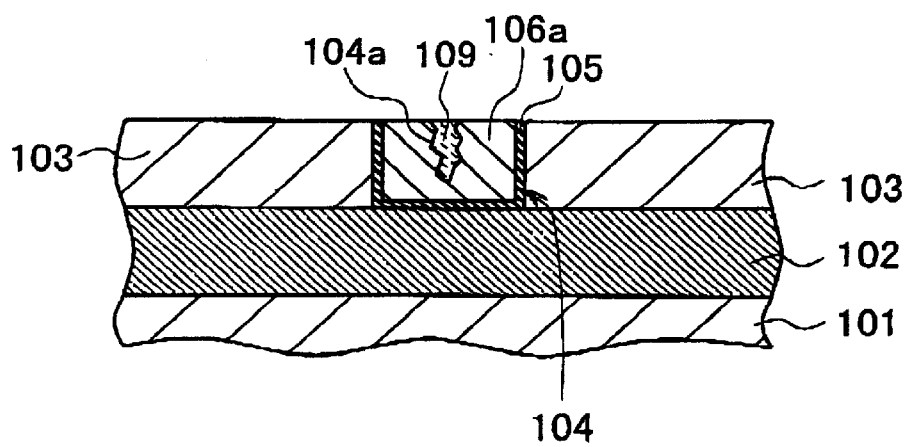

Subsequently, the titanium layer 109 serving as the protection layer and the tungsten layer 106 are removed until the surface of the second interlayer dielectric layer 103 is exposed from the layers 106 and 109 by a CMP process, thereby forming the contact plug 106a in the contact hole 104, as shown in FIG. 6B.

Since the gap 104a has been filled with the protection layer 109 in the prior step of forming the protection layer 109, no polishing residue is buried into the gap 104a during this CMP process.

Figure 6C:
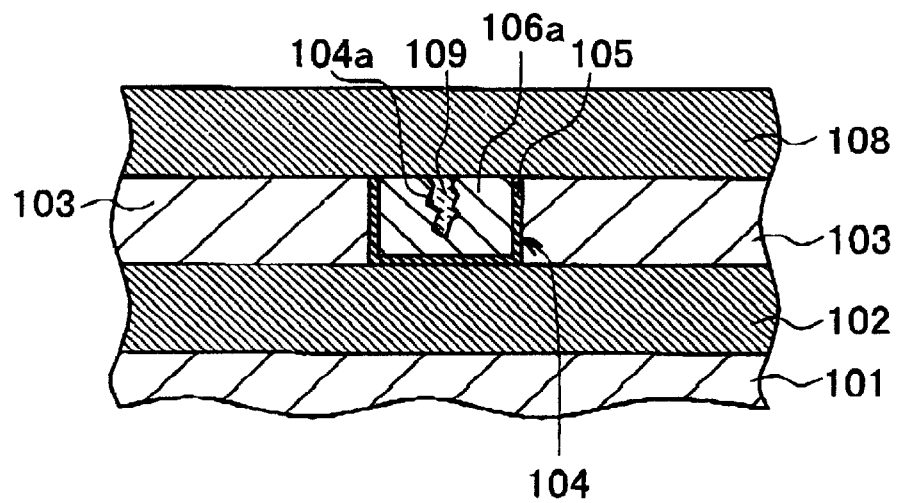

Unlike the first embodiment, the protection layer 109 left in the gap 104a is not removed. Then, the second-level wiring layer 108 is formed on the exposed and planarized surface of the second interlayer dielectric layer 103 by a known process, as shown in FIG. 6C.

Thus, the second-level wiring layer 108 is electrically connected to the first-level wiring layer 102 through the tungsten plug 106a and the titanium barrier layer 105 without leaving any polishing residue. Consequently, no contamination source to electronic devices on the substrate 100 exists and therefore, degradation of the performance and characteristics of the devices is prevented from occurring.

Because the gaps 104a and 124a are filled with the conductive titanium layers 109 and 129, respectively, there is an additional advantage that the contact resistance becomes lower than the first embodiment.

The barrier layer 125 and the metallic plug 126a are formed in the contact hole 124 of the first interlayer dielectric layer 101 in the same way as the barrier layer 105 and the metallic plug 106a.

THIRD EMBODIMENT

FIGS. 7A to 7E show a method of fabricating a semiconductor device with a trench capacitor according to a third embodiment.

Figure 7A:
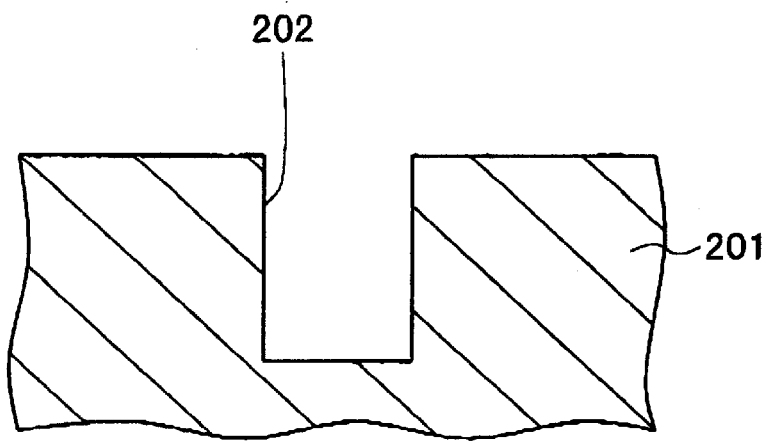
FIGS. 7A to 7E are partial, cross-sectional views showing the process steps of a method according to a third embodiment of the present invention, respectively.
Figure 7B:
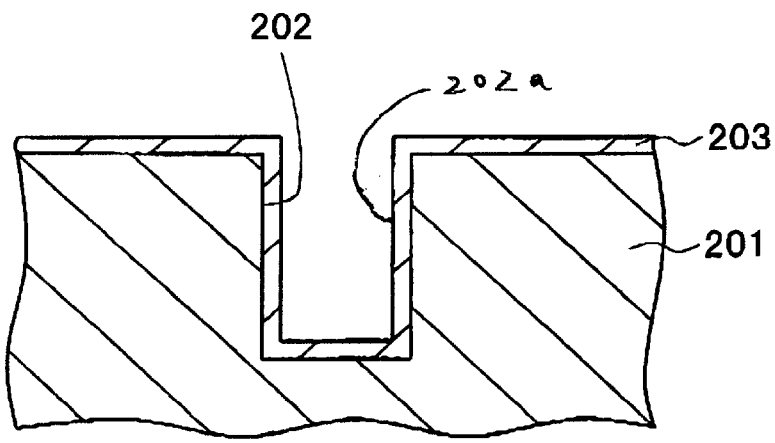

First, as shown in FIG. 7A, a trench 202 is formed in a surface area of a semiconductor substrate 201. Next, a silicon dioxide layer 203 is formed on the surface of the substrate 201 by a CVD process. As shown in FIG. 7B, the silicon dioxide (SiO$_2$) layer 203 covers not only the surface of the substrate 201 but also the side and bottom walls of the trench 202. As a result, a gap 202a is formed on the layer 203 in the trench 202.

Figure 7C:
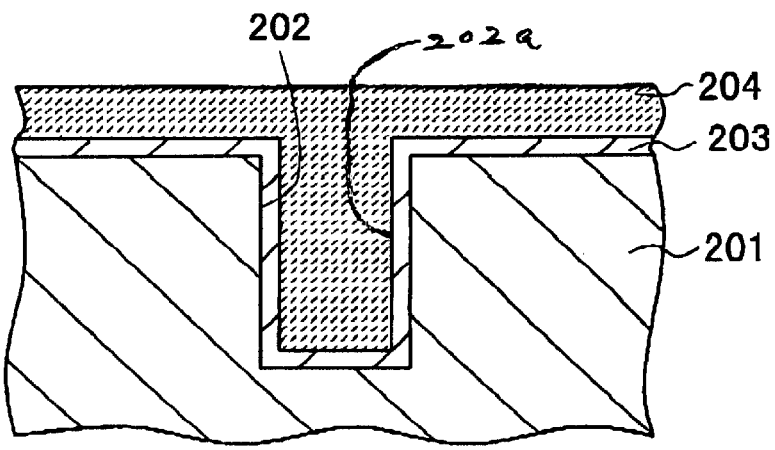

Subsequently, as shown in FIG. 7C, a polysilicon layer 204 serving as a protection layer is formed on the silicon dioxide layer 203 by a CVD process.

Figure 7D:
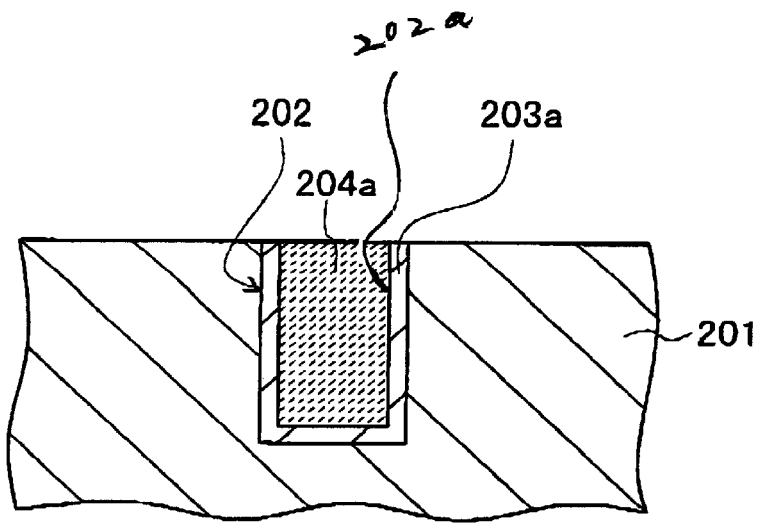

The polysilicon layer 204 and the silicon dioxide layer 203 are then removed until the surface of the substrate 201 is exposed from the layers 203 and 204 by a CMP process, thereby forming an upper electrode 204a of the trench capacitor in the gap 202a, as shown in FIG. 7D.

The substrate 201 serves as a lower electrode of the trench capacitor and the silicon dioxide layer 203 left in the trench 202 serves as a dielectric 203a thereof.

Since the trench 202 has been filled with the silicon dioxide layer 203 and the protection layer 204 in the prior step, no polishing residue is buried into the trench 202 during this CMP process.

Figure 7E:
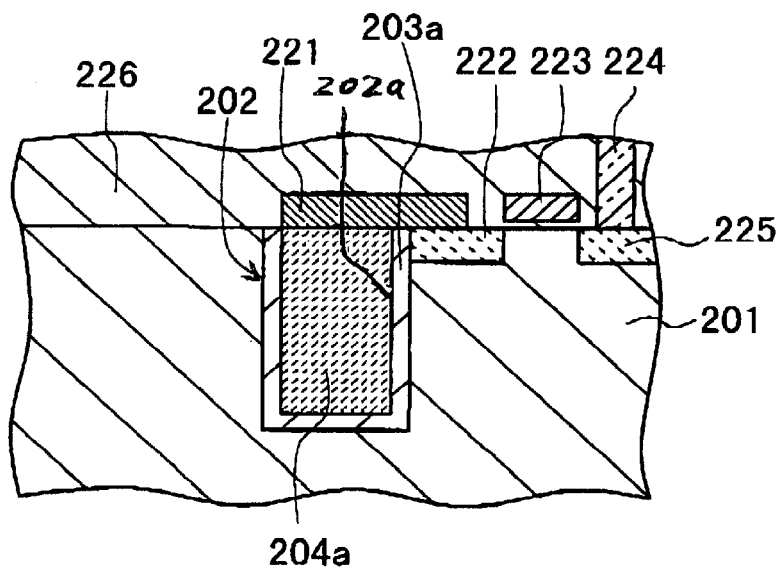

Further, as shown in FIG. 7E, a pair of source/drain regions 222 and 225 are formed in the substrate 201 by known processes. A gate electrode 223 is formed over the surface of the substrate 201 between the source and drain regions 222 and 225 through a gate insulating layer.

A wiring layer 221 is formed on the surface of the substrate 201 to electrically interconnect the upper electrode 204a and the source/drain region 222. An interlayer dielectric layer 226 is formed on the surface of the substrate 201 to cover the MOSFET and the trench capacitor. A contact plug 224 is formed in the interlayer dielectric layer 226 to be contacted with the source/drain region 225.

The MOSFET and the trench capacitor constitute a memory cell.

Thus, the trench capacitor is formed in the substrate 201 without leaving any polishing residue. Consequently, no contamination source to electronic devices on the substrate 201 exists and therefore, degradation of the performance and characteristics of the devices is prevented from occurring.

FOURTH EMBODIMENT

FIGS. 8A to 8E show a method of fabricating a semiconductor device with a trench isolation structure according to a fourth embodiment.

Figure 8A:
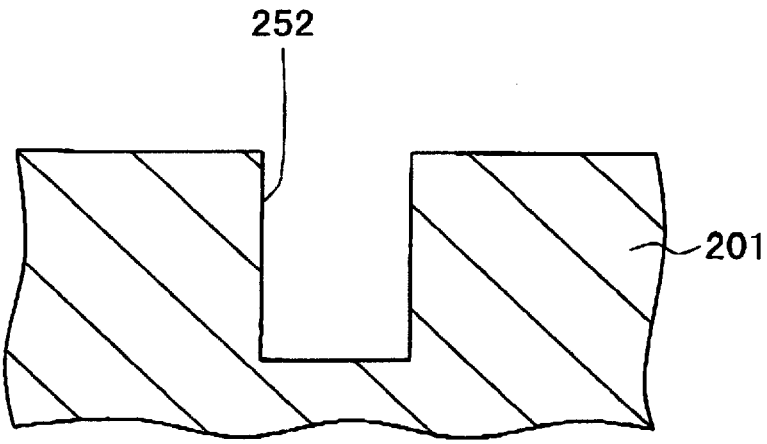
FIGS. 8A to 8E are partial, cross-sectional views showing the process steps of a method according to a fourth embodiment of the present invention, respectively.
Figure 8B:
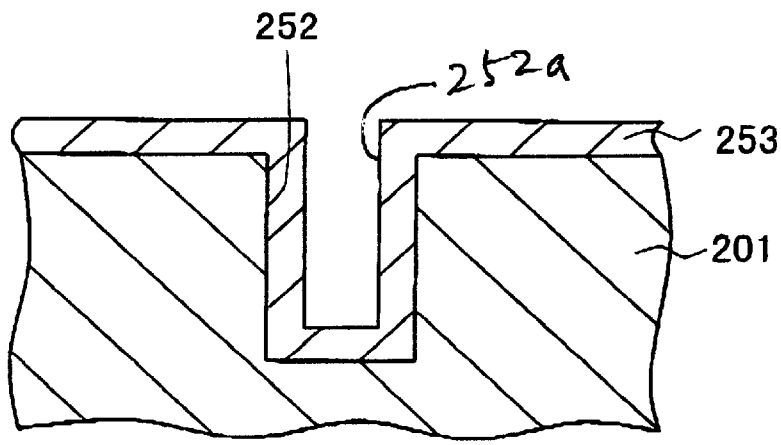

First, as shown in FIG. 8A, a trench 252 is formed in a surface area of a semiconductor substrate 201. Next, a silicon dioxide layer 253 is formed on the surface of the substrate 201 by a CVD process. As shown in FIG. 8B, the silicon dioxide layer 253 covers not only the surface of the substrate 201 but also the side and bottom walls of the trench 252. As a result, a gap 252a is formed on the layer 253 in the trench 252.

Figure 8C:
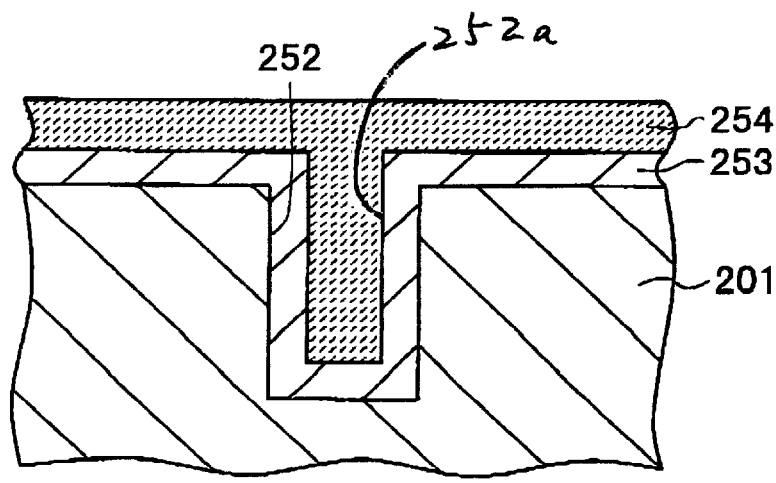

Subsequently, as shown in FIG. 8C, a SOG material layer 254 serving as a protection layer is formed on the silicon dioxide layer 253 by a spin coating process. As clearly seen from FIG. 8C, the trench 252 is completely filled with the SOG material layer 254 and the silicon dioxide layer 253. In other words, the gap 252a is filled with the SOG material layer 254.

A same SOC material as the SOG material layer 107 in the first embodiment may be used for the SOG material layer 254.

The SOG material layer 254 is then subjected to heat-treatment to fully cure the SOG material. The fully cured SOG material layer 254 behaves like a SiO$_2$ layer.

Figure 8D:
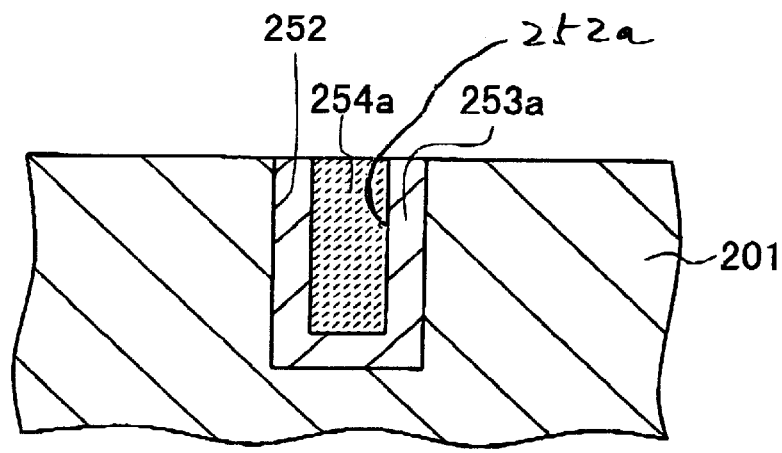

Further, the fully-cured SOC material layer 254 and the silicon dioxide layer 253 are then removed until the surface of the substrate 201 is exposed from the layers 253 and 254 by a CMP process, thereby forming isolation dielectrics 254a and 253a in the trench 252, as shown in FIG. 8D.

Since the trench 252 has been filled with the silicon dioxide layer 253 and the cured SOG material layer 254 in the prior step, no polishing residue is buried into the trench 252 during this CMP process.

Figure 8E:
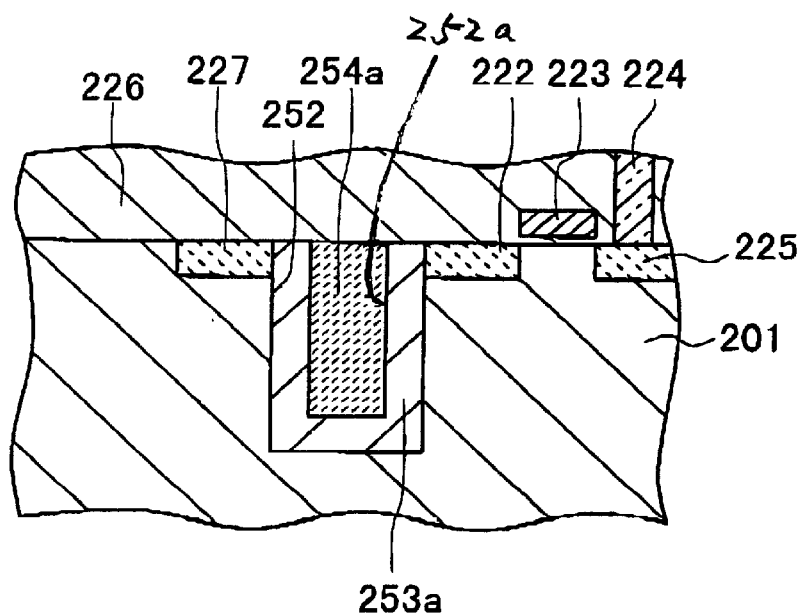

As shown in FIG. 8E, a pair of source/drain regions 222 and 225 are formed in the substrate 201 by known processes. A gate electrode 223 is formed over the surface of the substrate 201 between the pair of source/drain regions 222 and 225 through a gate insulating layer. The pair of source/drain regions 222 and 225 and the gate electrode 223 constitute a MOSFET.

A source/drain region 227 for another MOSFET is formed in the surface area of the substrate 201.

The two MOSFETs are electrically isolated by the trench isolation structure which is formed by the trench 252 filled with the isolation dielectrics 254a and 253a.

Any resist material layer such as a photoresist layer may be used instead of the SOG material layer 254.

Thus, the trench isolation structure is formed in the substrate 201 without leaving any polishing residue. Consequently, no contamination source to electronic devices on the substrate 201 exists and therefore, degradation of the performance and characteristics of the devices is prevented from occurring

FIFTH EMBODIMENT

Figure 9A:
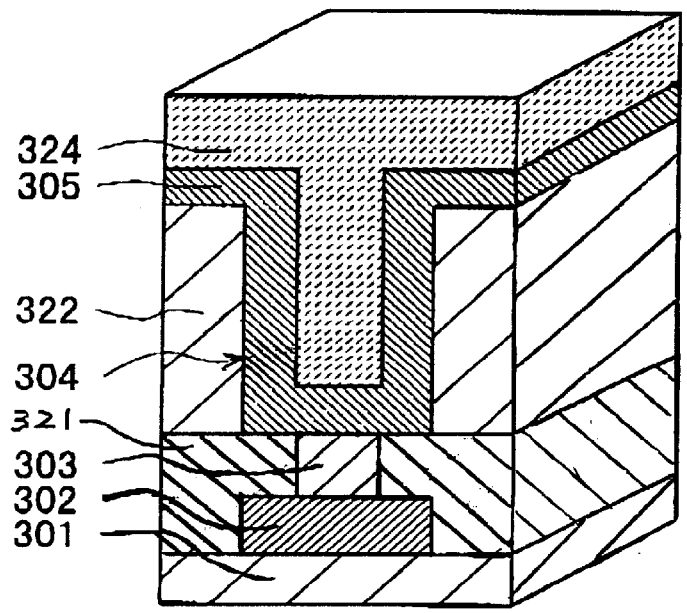
FIGS. 9A to 9C are partial, cross-sectional views showing the process steps of a method according to a fifth embodiment of the present invention, respectively.
Figure 9B:
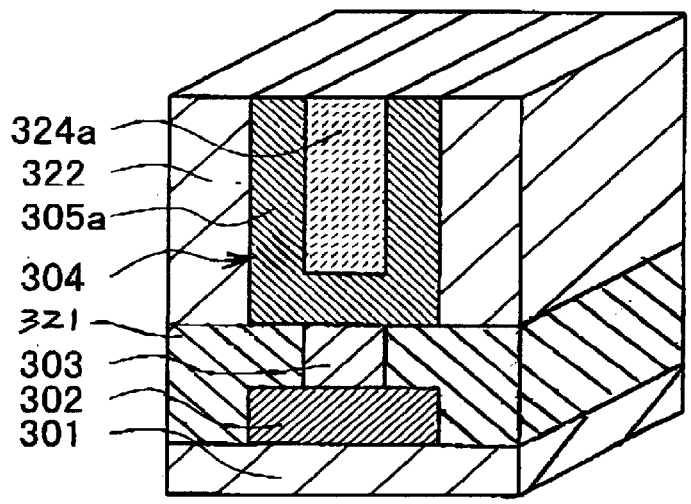
Figure 9C:
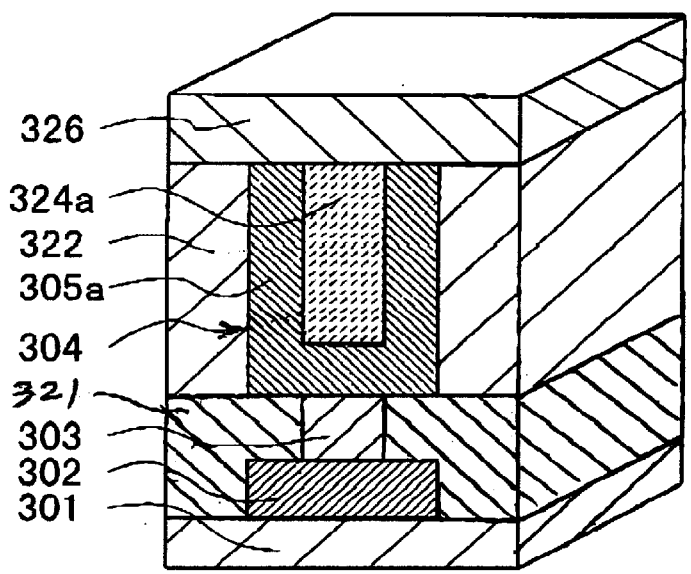

FIGS. 9A to 9C show a method of fabricating a semiconductor device with a damascene wiring structure according to a fifth embodiment.

First, as shown in FIG. 9A, a first-level wiring layer 302 is formed on a first interlayer dielectric layer 301. A second interlayer dielectric layer 321 is formed on the first interlayer dielectric layer 301 to cover the first-level wiring layer 302. A contact plug 303 is buried in the second interlayer dielectric layer 321 to be contacted with the first-level wiring layer 302. A third interlayer dielectric layer 322 is formed on the second Interlayer dielectric layer 321. A trench 304 is formed in the third interlayer dielectric layer 322.

Next, a metal layer 305 is formed on the third interlayer dielectric layer 322 to cover the trench 304 by a CVD process in the same way as the metallic barrier layer 105 in the first embodiment. The metal layer 305 is contacted with the underlying contact plug 303 at the bottom of the trench 304.

Subsequently, a protection layer 324 is formed on the metal layer 305 in the same way as the protection layer 106 in the first embodiment. Thus, the trench 304 is completely filled with the conductive layer 305 and the protection layer 324.

The protection layer 324 and the metal layer 305 are then removed until the surface of the third interlayer dielectric layer 322 is exposed from the layers 305 and 324 by a CMP process, thereby selectively leaving the conductive layer 305 and the protection layer 324, as shown in FIG. 9B. The conductive layer 305 and the protection layer 324 constitute the damascene wiring structure electrically connected to the first-level wiring layer 302 through the contact plug 303.

Since the trench 304 has been filled with the conductive layer 305 and the protection layer 324 in the prior step, no polishing residue is buried into the trench 304 during this CMP process.

Further, as shown in FIG. 9C, a fourth interlayer dielectric layer 326 is formed on the third interlayer dielectric layer 322 to cover the damascene wiring structure.

Thus, the damascene wiring structure is formed to be buried in the third interlayer dielectric layer 322 without leaving any polishing residue. Consequently, the first-level wiring layer 302 and the damascene wiring structure are not affected by polishing residue.

SIXTH EMBODIMENT

FIGS. 10A to 10D show a method of fabricating a semiconductor device with a memory cell structure according to a sixth embodiment.

Figure 10A:
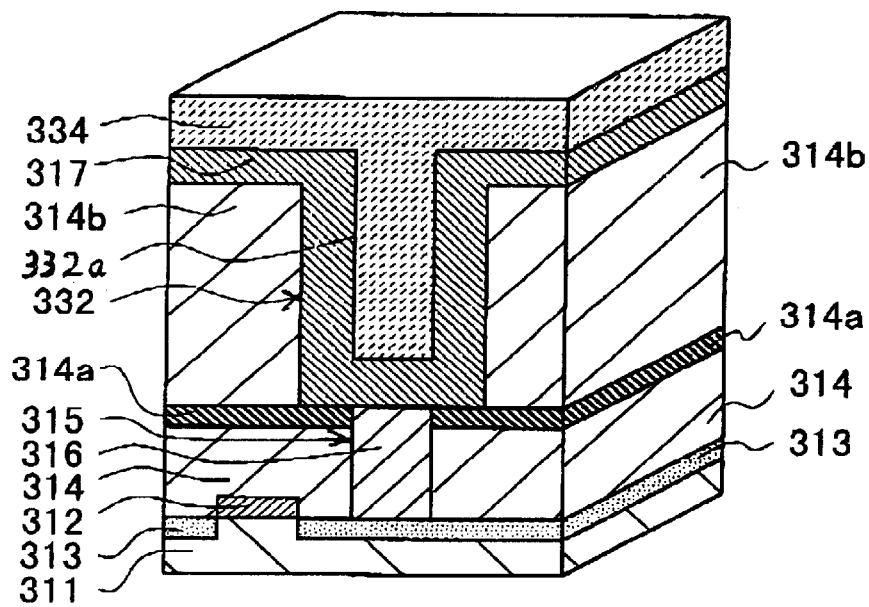
FIGS. 10A to 10D are partial, cross-sectional views showing the process steps of a method according to a sixth embodiment of the present invention, respectively.

First, as shown in FIG. 10A, a pair of source/drain regions 313 are formed in a surface area of a semiconductor substrate 311. A gate electrode 312 is formed over the surface of the substrate 311 between the pair of source/drain regions 313 through a gate insulating layer (not shown).

A first interlayer dielectric layer 314 is formed on the surface of the semiconductor substrate 311 to cover the gate electrode 312. An etch stop layer 314a is formed on the first interlayer dielectric layer 314. A contact hole 315 is formed to penetrate the first interlayer dielectric layer 314 and the etch stop layer 314a. A conductive plug 316 is buried in the contact hole 315 to be contacted with one of the pair of source/drain regions 313. A second interlayer dielectric layer 314b is formed on the etch stop layer 314a to cover the contact hole 315. A hole 332 is formed in the second interlayer dielectric layer 314b.

Next, a metal layer 317 is formed on the second interlayer dielectric layer 314b to cover the hole 332 by a CVD process in the same way as the metallic barrier layer 105 in the first embodiment. The metal layer 317 is contacted with the underlying contact plug 316 at the bottom of the hole 332. A gap 332a is produced on the layer 317 in the hole 332.

Subsequently, a protection layer 334 is formed on the metal layer 317 in the same way as the protection layer 106 in the first embodiment. Thus, the hole 332 is completely filled with the metal layer 317 and the protection layer 334. In other words, the gap 332a is fully filled with the protection layer 334.

Figure 10B:
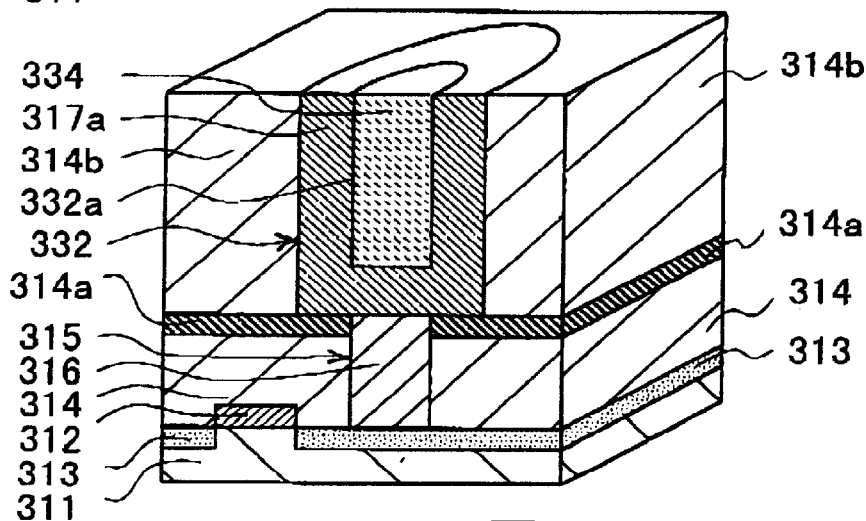

The protection layer 334 and the metal layer 317 are then removed until the surface of the second interlayer dielectric layer 314b is exposed from the layers 334 and 317 by a CMP process, thereby selectively leaving the metal layer 317 and the protection layer 334, as shown in FIG. 10B.

The remaining metal layer 317a, which has an approximately cylindrical shape, serves as a lower electrode of a storage capacitor electrically connected to the underlying source/drain region 313.

Since the hole 332 has been filled with the lower electrode 317a and the protection layer 324 in the prior step, no polishing residue is buried into the hole 332 during this CMP process.

Figure 10C:
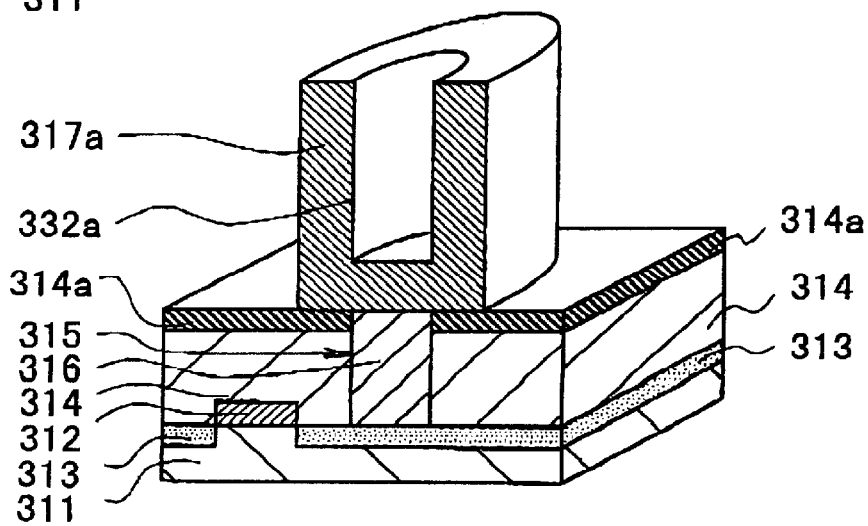

Further, as shown in FIG. 10c, the remaining protection layer 334 and the second interlayer dielectric layer 314b are selectively removed so as to expose the etch stop layer 314a, thereby finishing the lower electrode 317a.

Figure 10D:
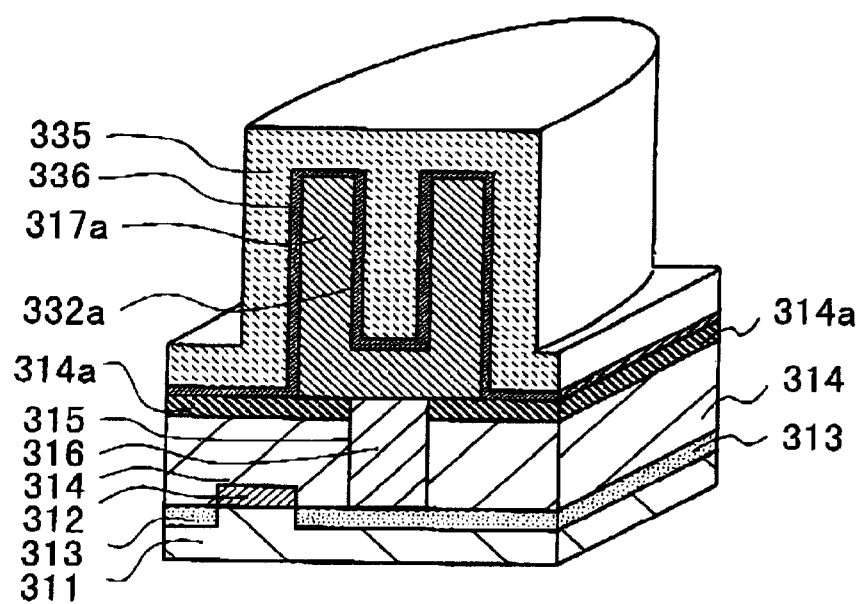

As shown in FIG. 10D, a dielectric layer 336 is then formed on the etch stop layer 314a to cover the inner and outer surfaces of the lower electrode 317a. An upper electrode 335 is formed on the dielectric layer 336.

Thus, the cylindrical capacitor is constituted by the lower and upper electrodes 317a and 335 and the intervening dielectric layer 336.

The MOSFET and the storage capacitor constitute a memory cell.

SEVENTH EMBODIMENT

Figure 11A:
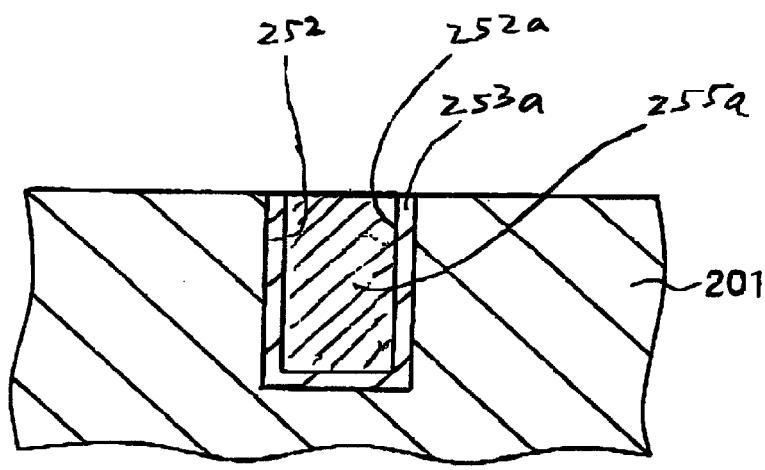
FIGS. 11A and 11B are partial, cross-sectional views showing the process steps of a method according to a seventh embodiment of the present invention, respectively.
Figure 11B:
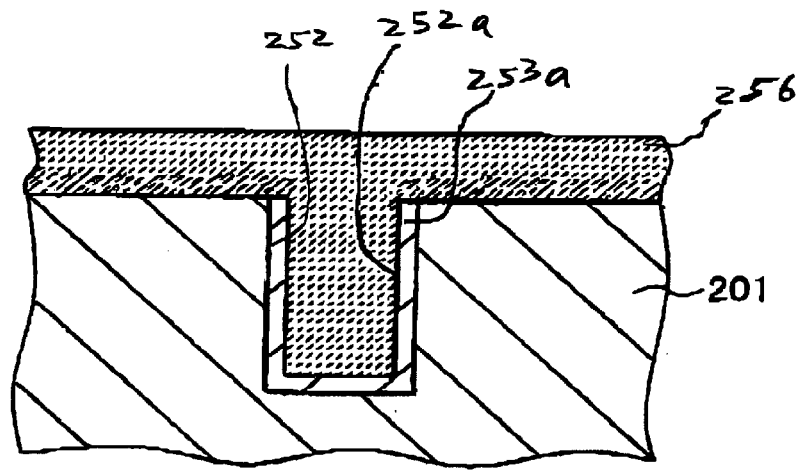

FIGS. 11A and 11B show a method of fabricating a semiconductor device with a trench isolation structure according to a seventh embodiment. This embodiment is a variation of the fourth embodiment.

Through the same process steps as shown in FIGS. 8A to 8D, the isolation dielectric 253a and a resist plug 255a are formed in the trench 252, as shown in FIG. 11A.

Next, unlike the fourth embodiment, the plug 255a is selectively removed by a plasma ashing process using an oxygen-containing gas.

Subsequently, a dielectric layer 256 is formed on the exposed surface of the substrate 201 to cover the trench 252. filling completely the trench 252.

Thus, the trench isolation structure, in which the trench 252 is filled with the two different dielectric materials 253a and 256, is formed in the substrate 201 without leaving any polishing residue. Consequently, no contamination source to electronic devices on the substrate 201 exists and therefore, degradation of the performance and characteristics of the devices is prevented from occurring.

In the first to seventh embodiments, the protection layer is made of a metal, or a SOG or resist material. However, any other material may be used for the protection layer in the present invention. For example, Phospho-Silicate Glass (PSG), Born-doped, Phospho-Silicate Glass (RPSG), undoped silicate glass may be used. Additionally, any inorganic materials, such as $SiO_2$ deposited by an Electron Cyclotron Resonance (ECR) plasma-enhanced CVD process or a high-density plasma-enhanced CVD process may be used. Any organic material having a good gap-filling ability such as polyimide may be used also.

Further, any metallic material listed as above may be used for the protection layer. It is preferred that these metallic material is produced by a CVD process because CVD-deposited metallic materials have a good gap-filling ability.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A fabrication method of a semiconductor device, comprising the steps of:

(a) preparing a first layer having a hole;

(b) forming a second layer to cover side walls and a bottom of said hole;

said hole being not filled with said second layer to thereby form a gap on said second layer, said gap being located in a central portion of said hole;

(c) forming a protection layer on said second layer so that said gap is filled with said protection layer;

(d) removing said protection layer and said second layer by a CMP process until said first layer is exposed, thereby selectively leaving said protection layer and said second layer in said hole;

said second layer left in said hole serving as a plug;

(e) forming a third layer on said second layer to cover said plug; and (f) selectively removing said protection layer left in said gap between said steps (d) and (e).

2. A method as claimed in claim 1, wherein said protection layer is made of a metal or its compound capable of filling said gap.

3. A method as claimed in claim 1, wherein said protection layer is made of one selected from the group consisting of aluminum (Al), copper (Cu), titanium (Ti), titanium nitride (TiN), titanium tungstenide (TiW), tantalum (Ta), tantalum nitride (TaN), tantalum tungstenide (TaW), tungsten silicide (WSi), and titanium silicide (TiSi).

4. A method as claimed in claim 1, wherein said protection layer is made of a material capable of coating.

5. A method as claimed in claim 1, wherein said protection layer is made of one selected from the group consisting of a SOG material and a resist material.

6. A fabrication method of a semiconductor device, comprising the steps of:

(a) preparing a first layer having a hole;

(b) forming a second layer to cover side walls and a bottom of said hole;

said hole being not filled with said second layer to thereby form a gap on said second layer, said gap being located in a central portion of said hole;

(c) forming a protection layer on said second layer so that said gap is filled with said protection layer;

(d) removing said protection layer and said second layer by a CMP process until said first layer is exposed, thereby selectively leaving said protection layer and said second layer in said hole;

said second layer left in said hole serving as a plug; and (e) forming a third layer on said second layer to cover said plug, wherein said first layer is made of an electrically insulative material, said second layer is made of a metallic material, and said third layer is made of an electrically insulating material.

7. A fabrication method of a semiconductor device, comprising the steps of:

(a) preparing a first layer having a hole;

(b) forming a second layer to cover side walls and a bottom of said hole;

said hole being not filled with said second layer to thereby form a gap on said second layer, said gap being located in a central portion of said hole;

(c) forming a protection layer on said second layer so that said gap is filled with said protection layer;

(d) removing said protection layer and said second layer by a CMP process until said first layer is exposed, thereby selectively leaving said protection layer and said second layer in the hole; and (e) removing said first layer and said protection layer left in said gap;

(f) forming a third layer made of an electrically insulating layer to cover said second layer; and (g) forming a fourth layer made of an electrically conductive layer to cover said dielectric layer;

wherein said second layer is made of an electrically conductive material.

8. A method as claimed in claim 7, wherein said first layer is formed by a semiconductor substrate, said second layer is made of an electrically insulating material, and said protection layer is made of an electrically conductive material.

9. A method as claimed in claim 7, wherein said first layer is formed by a semiconductor substrate, said second layer is made of an electrically insulating material, and said protection layer is made of an electrically insulating material.

10. A method as claimed in claim 7, wherein said first layer is made of a electrically insulating material, and at least one of said second layer and said protection layer is made of an electrically conductive material.

11. A fabrication method of a semiconductor device, comprising the steps of:

(a) preparing a first layer having a hole;

(b) forming a second layer to cover said hole;

said hole being not filled with said second layer to thereby form a gap on said second layer;

(c) forming a protection layer on said second layer so that said gap is filled with said protection layer;

(d) removing said protection layer and said second layer by a CMP process until said first layer is exposed, thereby selectively leaving said protection layer and said second layer in said hole;

said second layer left in said hole serving as a plug; and (e) forming a third layer on said second layer to cover said plug;

wherein said protection layer is made of one selected from the group consisting of a SOG material and a resist material.

12. A method as claimed in claim 11, further comprising a step (f) of selectively removing said protection layer left in said gap between said steps (d) and (e).

13. A method as claimed in claim 11, wherein said first layer is made of an electrically insulating material, said second layer is made of a metallic material, and said third layer is made of an electrically insulating material.

14. A fabrication method of a semiconductor device, comprising the steps of:

(a) preparing a first layer having a hole;

(b) forming a second layer to cover said hole;

said hole being not filled with said second layer to thereby form a gap on said second layer;

(c) forming a protection layer on said second layer so that said gap is filled with said protection layer; and (d) removing said protection layer and said second layer by a CMP process until said first layer is exposed, thereby selectively leaving said protection layer and said second layer in the hole;

wherein said protection film is an electrically insulating material.

15. A method as claimed in claim 14, further comprising the steps of:

(e) removing said first layer and said protection layer left in said gap;

(f) forming a third layer made of an electrically insulating layer to cover said second layer; and (g) forming a fourth layer made of an electrically conductive layer to cover said dielectric layer;

wherein said second layer is made of an electrically conductive material.

* * * * *